(12) United States Patent
Stoyan

(10) Patent No.: US 7,872,278 B2
(45) Date of Patent: Jan. 18, 2011

(54) LIGHT EMITTING DIODE SYSTEM, METHOD FOR PRODUCING SUCH A SYSTEM, AND BACKLIGHTING DEVICE

(75) Inventor: Harald Stoyan, Regensburg (DE)

(73) Assignee: OSRAM Gesellschaft mit beschränkter Haftung, München (DE)

( * ) Notice: Subject to any disclaimer, the term of this patent is extended or adjusted under 35 U.S.C. 154(b) by 480 days.

(21) Appl. No.: 11/973,712

(22) Filed: Oct. 9, 2007

(65) Prior Publication Data
US 2008/0087911 A1    Apr. 17, 2008

(30) Foreign Application Priority Data
Oct. 11, 2006    (DE)    ........................ 10 2006 048 230

(51) Int. Cl.
*H01L 27/15*    (2006.01)
*H01L 29/22*    (2006.01)

(52) U.S. Cl. .............................. 257/99; 257/79; 257/98; 257/100; 257/433; 257/434; 257/706; 257/707; 438/122; 438/125

(58) Field of Classification Search .................... 257/79, 257/98–100, 433, 434, 706–707; 438/122, 438/125
See application file for complete search history.

(56) References Cited

U.S. PATENT DOCUMENTS

| | | | |
|---|---|---|---|
| 6,274,924 B1 | 8/2001 | Carey et al. | |
| 6,949,772 B2 | 9/2005 | Shimizu et al. | |
| 6,999,318 B2 * | 2/2006 | Newby | ........................ 361/719 |
| 7,592,631 B2 * | 9/2009 | Park et al. | ...................... 257/81 |

| | | |
|---|---|---|
| 2005/0024834 A1 | 2/2005 | Newby |
| 2006/0043382 A1 | 3/2006 | Matsui et al. |

(Continued)

FOREIGN PATENT DOCUMENTS

DE    102 29 067    1/2004

(Continued)

OTHER PUBLICATIONS

OSRAM Opto Semiconductors GmbH, "Thermal Management of Golden DRAGON LED", http://catalog.osram-os.com/media/_en/Graphics/00036578_0.pdf.

(Continued)

*Primary Examiner*—Kenneth A Parker
*Assistant Examiner*—Joseph Nguyen
(74) *Attorney, Agent, or Firm*—Cohen Pontani Lieberman & Pavane LLP

(57) ABSTRACT

A light-emitting diode system (1) comprising at least one light-emitting diode component (2), in which a light-emitting diode chip is arranged in a light-emitting diode housing (21) on a heat sink (22) which can be thermally connected at the rear side (25) of the light-emitting diode housing (21). A carrier plate (3) having a front side (34) and a rear side (31) and a hole for receiving the light-emitting diode component (2) is provided. The light-emitting diode component (2) projects into the hole from the rear side (31) of the carrier plate (3). An electrically insulating thermal connection layer (5) is applied at the rear side (31) of the carrier plate (3), said thermal connection layer being thermally conductively connected to the heat sink (22). A method for producing a light-emitting diode system is also described.

20 Claims, 3 Drawing Sheets

U.S. PATENT DOCUMENTS

| | | | |
|---|---|---|---|
| 2006/0098441 | A1 | 5/2006 | Chou |
| 2006/0202210 | A1* | 9/2006 | Mok et al. .................... 257/79 |
| 2006/0232969 | A1 | 10/2006 | Bogner et al. |
| 2007/0030703 | A1* | 2/2007 | Lee et al. .................... 362/800 |
| 2008/0023721 | A1* | 1/2008 | Lee et al. ...................... 257/99 |

FOREIGN PATENT DOCUMENTS

| | | |
|---|---|---|
| DE | 102 45 892 | 5/2004 |
| DE | 20 2005 012 652 | 12/2005 |
| DE | 10 2005 011 857 | 9/2006 |
| WO | WO 02/084749 | 10/2002 |
| WO | WO 2006/097225 | 9/2006 |

OTHER PUBLICATIONS

The Bergquist Company, Sil-Pad®, http://www.bergquistcompany.com/objects/Thermal_Materials/Sil_Pad/Sil_Pad_Tables/SPComparison2.pdf, e.g. Sil-Pad® 800-Folie.

* cited by examiner

LIGHT EMITTING DIODE SYSTEM, METHOD FOR PRODUCING SUCH A SYSTEM, AND BACKLIGHTING DEVICE

RELATED APPLICATIONS

This patent application claims the priority of German patent application 10 2006 048 230.1 filed Oct. 11, 2006, the disclosure content of which is hereby incorporated by reference.

FIELD OF THE INVENTION

The invention relates to a light-emitting diode system comprising at least one light-emitting diode component, in which a light-emitting diode chip is arranged in a light-emitting diode housing on a heat sink which can be thermally connected at the rear side of the light-emitting diode housing. It furthermore relates to a method for producing such a light-emitting diode system, and to a backlighting device.

BACKGROUND OF THE INVENTION

Light-emitting diode components in which a light-emitting diode chip is arranged in a light-emitting diode housing on a thermal connection part (also called heat sink) which can be thermally connected at the rear side of the light-emitting diode housing are described in published US patent application 2004/0075100 A1 and U.S. Pat. No. 6,274,924, the disclosure content of both of which is hereby incorporated by reference.

Such light-emitting diode components have hitherto been mounted, in light-emitting diode systems, onto conventional printed circuit boards using surface mounting technology in such a way that the heat sink bears on the printed circuit board. In order to improve the heat dissipation from the light-emitting diode chip, the printed circuit board substrates can have thermal through-connections toward the heat sink. Devices of this type are described in the application document of April 2006 "Thermal Management of Golden DRAGON® LED" in the name of Osram Opto Semiconductors GmbH (see http://catalog.osram-os.com/media/ en/Graphics/ 00036578 0.pdf).

SUMMARY OF THE INVENTION

One object of the present invention is to provide a light-emitting diode system with means that are technically as simple as possible for dissipating the heat from the light-emitting diode components.

Another object of the present invention is to provide a method for producing such a light-emitting diode system.

One aspect of the present invention is directed to a light-emitting diode system comprising at least one light-emitting diode component, in which a light-emitting diode chip is arranged in a light-emitting diode housing on a heat sink which can be thermally connected at the rear side of the light-emitting diode housing; wherein a carrier plate having a front side and a rear side and a hole for receiving the light-emitting diode component, wherein said the light-emitting diode component projects into the hole from the rear side of the carrier plate; and an electrically insulating thermal connection layer at the rear side of said carrier plate, said thermal connection layer being thermally conductively connected to said heat sink.

In at least one embodiment, in the case of a light-emitting diode system of the type mentioned in the introduction, a carrier plate having a front side and a rear side and a hole for receiving the light-emitting diode component is provided. In this case, the light-emitting diode component is inserted into the hole from the rear side of the carrier plate, in such a way that the front side of the light-emitting diode component, through which the latter emits light, faces toward the hole.

In one expedient configuration, the front side of the light-emitting diode component is situated completely in the hole. In another expedient configuration the front side of the light-emitting diode component projects at least partly from the carrier plate at the front side thereof.

In accordance with at least one embodiment, an electrically insulating thermal connection layer ("thermal connection layer" hereinafter) is applied at the rear side of the carrier plate, said thermal connection layer being thermally conductively connected to the heat sink. It can be applied in a simple manner over the area of the rear side of the carrier plate and be thermally coupled to the heat sink. The latter can be effected in a simple manner by pressing on the thermal connection layer or by connection by means of a thermally conductive connecting means such as conductive adhesive. In accordance with one expedient configuration, the thermal connection layer is a thermally conductive electrical insulation film, for example, comprising a material having the designation Sil-Pad® from The Bergquist Company, USA (see http:// www.bergquistcompany.com/objects/Thermal_Materials/ Sil_Pad/Sil_Pad_Tables/SPC omparison2.pdf), for example Sil_Pad® 800 film.

In accordance with at least one embodiment, the light-emitting diode component has electrical connection strips, which project in wing-like fashion laterally from the light-emitting diode housing. These are, for example, metal strips of an electrical leadframe onto which the light-emitting diode housing is integrally formed, for example, by means of injection molding or transfer molding or by means of some other plastic shaping method. Said connection strips bear partly on the rear side of the carrier plate and are connected to the latter there.

If electrical connection tracks (so-called "conductor tracks") are provided on the carrier plate, in particular for the purpose of interconnecting the light-emitting diode component with an electrical drive circuit or with further light-emitting diode components arranged in the carrier plate, then in one expedient configuration the connection strips are directly electrically conductively connected to assigned connection tracks, for example, by means of a metallic solder, or by means of an electrically conductive adhesive.

In accordance with at least one embodiment, the electrical connection strips project from the light-emitting diode housing like wings on opposite sides of said housing. They are bent away from the light-emitting diode housing firstly in each case by means of a first bend toward the rear side of the light-emitting diode housing, said rear side being remote from the carrier plate, and then bent away from the light-emitting diode housing again by means of a second bend. When the light-emitting diode component has been inserted into the hole, the first bend and at least one partial region between the first and the second bend are sunk in the hole of the carrier plate, and at least one partial region of the connection strip bears on the rear side of the carrier plate, or on the electrical connection tracks present thereon, after the second bend. Connection strips formed in this way are also referred to as "reverse gull-wing".

In accordance with at least one embodiment of the light-emitting diode system, a cooling body is applied on that side of the thermal connection layer which is remote from the carrier plate.

In accordance with at least one embodiment of the light-emitting diode system, a holding frame is provided, which fixes the carrier plate and the thermal connection layer with respect to one another. In one expedient configuration, the holding frame has a holding lug which runs around at the carrier plate or a plurality of holding lugs which are at a distance from one another and are arranged around the carrier plate, and which bear on the front side of the carrier plate. On the rear side of the carrier plate, the thermal connection layer projects laterally beyond the carrier plate and into cutouts of the holding frame. In the case of this arrangement the carrier plate is clamped between the holding lug/lugs and the thermal connection layer.

In accordance with at least one embodiment of this light-emitting diode system, the holding frame is provided with fixing elements, for example snap-action hooks, which project beyond the thermal connection layer on the rear side and by means of which the carrier plate including light-emitting diode component and thermal connection layer is fixed on a cooling body or a system carrier.

In accordance with at least one embodiment of the light-emitting diode system, a gap is provided between the lateral edge of the carrier plate and the holding frame, said gap functioning as an expansion joint in the event of thermal expansion of the carrier plate. The same applies analogously to the thermal connection layer unless it is composed of soft material which can compensate for thermal expansions in some other way.

In accordance with at least one embodiment of the light-emitting diode system, the carrier plate has a plurality of holes each having a light-emitting diode component. In one advantageous configuration of such a multi-light-emitting diode system, a single thermal connection layer spans the plurality of light-emitting diode components. It is also conceivable, however, for the thermal connection layer to be in a plurality of parts and for each part to span only a partial group of the plurality of light-emitting diode components.

Another aspect of the present invention is directed to a method for producing a light-emitting diode system comprising at least one light-emitting diode component, in which a light-emitting diode chip is arranged in a light-emitting diode housing on a heat sink which can be thermally connected at the rear side of the light-emitting diode housing. At least one hole for receiving the at least one light-emitting diode component is formed in a carrier plate having a front side and a rear side. The light-emitting diode component is subsequently inserted into the hole from the rear side and an electrically insulating thermal connection layer is applied to the rear side of the carrier plate and the heat sink.

In accordance with at least one embodiment, electrical connection strips projecting laterally from the light-emitting diode housing are formed at the light-emitting diode component. When the light-emitting diode component is inserted into the hole, said connection strips are then placed onto associated electrical connection pads of electrical connection tracks of the carrier plate. Afterward, the electrical connection strips are then electrically conductively connected to the electrical connection tracks, for example, by means of a selective soldering method (e.g. selective wave soldering or laser soldering) or by means of a conventional wave soldering method.

During the connection of the electrical connection strips of the light-emitting diode component to the connection tracks of the carrier plate, the light-emitting diode component can be pressed onto the carrier plate in a simple manner by means of a covering element, for example a covering film or a covering plate, and be held in the desired position. For this purpose, the covering element advantageously comprises a frame with transverse web running over the rear side of the light-emitting diode component. The covering element therefore has cutouts through which each connection strip is at least partly uncovered for soldering.

A light-emitting diode system according to the invention is advantageously suitable in particular for use in backlighting modules, in particular for LCD screens, which require a multiplicity of high-power light-emitting diode components that generate considerable heat loss.

DETAILED DESCRIPTION OF THE DRAWINGS

In the exemplary embodiments and figures, similar and similarly acting component parts are in each case provided with the same reference symbols. The elements illustrated should not be regarded as true to scale; rather, individual elements can be illustrated with an exaggerated size with respect to other elements in order to afford a better understanding.

Figure 1:
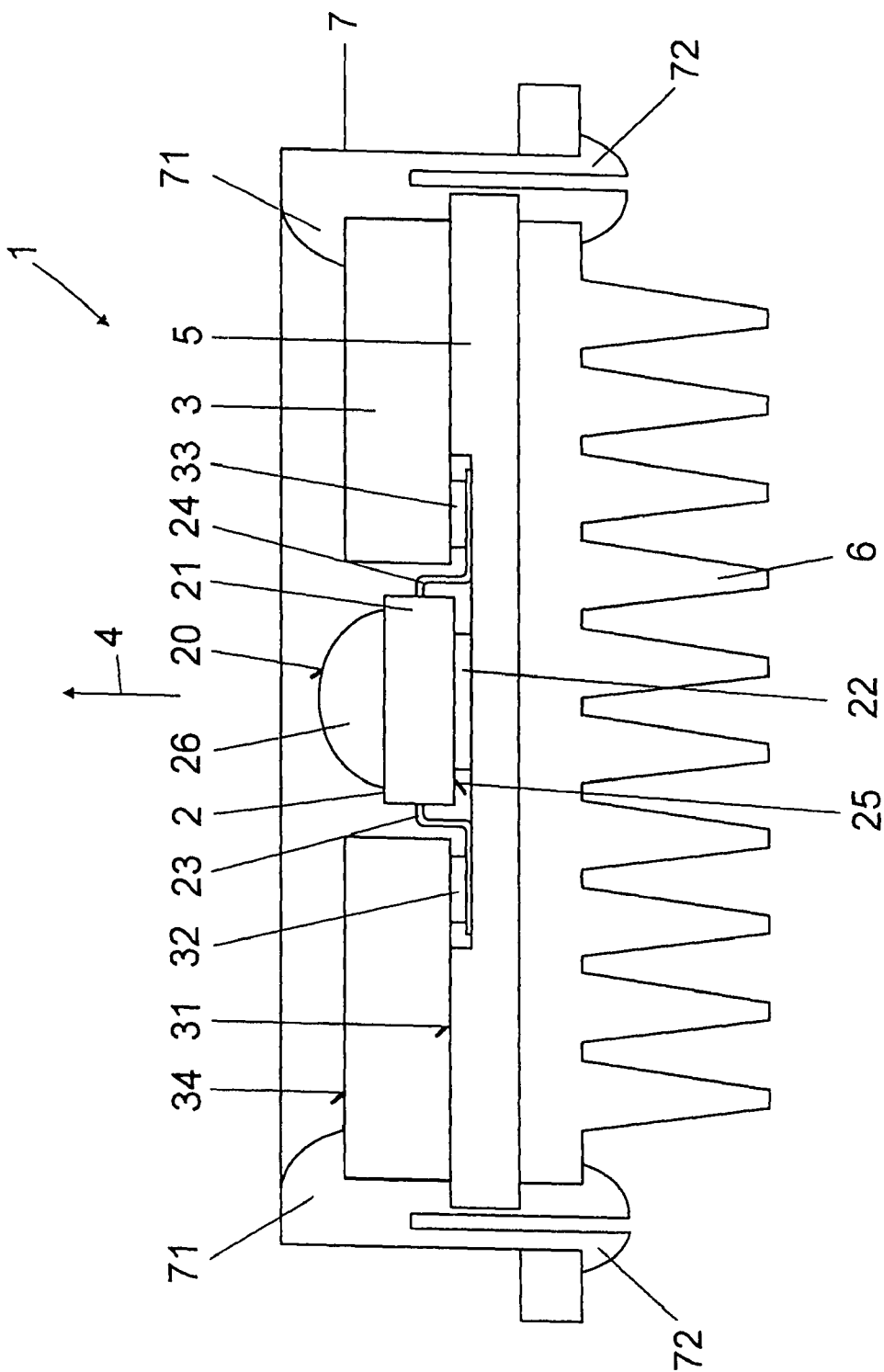
FIG. 1 shows a schematic illustration of a section through a complete light-emitting diode system.

In the case of the light-emitting diode system 1 illustrated in FIG. 1, a light-emitting diode component 2 is arranged in a hole of a rectangular carrier plate 3. In this case, the light-emitting diode component 2 is inserted into the hole with its front side 20, through which it emits light (indicated by the arrow 4), from the rear side 31 of the carrier plate 3.

The carrier plate 3 is, for example, a conventional printed circuit board (also called PCB) with electrical conductor tracks 32, 33 for interconnecting the light-emitting diode component 2 with other electronic components of the light-emitting diode system 1, in particular a drive circuit and, if appropriate, further light-emitting diode components.

The light-emitting diode component 2 has a light-emitting diode housing 21 with a heat sink 22, which can be thermally connected at the rear side 25 of the light-emitting diode housing 21. Furthermore, the light-emitting diode housing 21 comprises laterally projecting electrical connection pins 23, 24 of a metallic leadframe and, on the front side, an optical lens 26.

In the light-emitting diode housing 21, a light-emitting diode chip (not illustrated) is mounted on the heat sink 22 by means of a thermally conductive adhesive or by means of a metallic solder. Electrical connection pads of the light-emitting diode chip are electrically conductively connected to the electrical connection pins 23, 24 in the light-emitting diode housing 21, for example by means of bonding wires. The basic construction principle of such a light-emitting diode component is described in the above-mentioned US 2004/0075100 A and U.S. Pat. No. 6,274,924 and is, therefore, not explained further at this juncture.

An electrically insulating thermal connection layer 5 is applied at the rear side of the carrier plate 3, said connection layer bearing directly on the heat sink 22 or being connected to the heat sink 22 in some other way by means of a thermally conductive connecting means, for example a thermally conductive adhesive. As shown in FIG. 1, the thermal connection layer 5 has a cutout in the region of the light-emitting diode component 2 and the connection pins 23, 24 thereof, in such a way that the rest of the front side of the thermal connection layer 5 bears against the carrier plate 3.

The thermal connection layer 5 is a thermally conductive insulation film, for example, comprising a material having the designation Sil-Pad® from The Bergquist Company, USA (see http://www.bergquistcompany.com/objects/Thermal_Materials/Sil_Pad/Sil_Pad_Tables/SPC omparison2.pdf), for example Sil_Pad® 800 film.

In an alternative configuration, the front side—facing the carrier plate 3—of the thermal connection layer 5 is formed in planar fashion, that is to say has no cutout there, and at least one spacer on which the carrier plate bears is provided laterally with respect to the light-emitting diode component 2 between the carrier plate 3 and the thermal connection layer 5.

In yet another configuration, the thermal connection layer 5 is formed such that it is so soft and deformable that it can compensate for unevennesses to an extent such that the rear side of the light-emitting diode component 2 including heat sink 22 and connection pins 23, 24 press into it. A corresponding cutout (as described above) in the thermal connection layer 5 is not necessary in that case. A suitable material in this regard for the thermal connection layer 5 is, for example, the Sil-Pad® 800 already mentioned above.

The electrical connection strips 23, 24 project from the light-emitting diode housing 21 like wings on mutually opposite lateral areas of said housing. They are bent away from the light-emitting diode housing firstly in each case by means of a first bend toward the rear side of said housing and then bent away again by means of a second bend. The first bends and at least one partial region between the first and the second bend are situated in the hole of the carrier plate. A partial region of each connection strip 23, 24, after the second bend, bears in each case on an electrical connection or conductor track 32, 33—arranged laterally with respect to the hole—of the carrier plate 3 and is connected to the latter there by means of a metallic solder or by means of an electrically conductive adhesive.

The light-emitting diode system 1 has a holding frame 7 running around the carrier plate 3, which holding frame fixes the carrier plate 3 and the thermal connection layer 5 with respect to one another. For this purpose, the holding frame 7 has, on the one hand, at the front side 34 of the carrier plate 3, a holding lug 71 running around the latter and bearing on the front side 34 of the carrier plate 3. On the other hand, the thermal connection layer 5 projects laterally beyond the carrier plate 3 and is latched into a cutout of the holding frame 7, such that the carrier plate 3 is clamped between the holding lug 71 and the thermal connection layer 5.

As an alternative, the holding lug 71 does not run around carrier plate 3; rather, the holding frame 7 has a plurality of holding lugs (not illustrated) which are arranged around the carrier plate 3 and which at a distance from one another.

A gap (not illustrated) is provided between the lateral edge of the carrier plate 3 and the holding frame 7, said gap functioning as an expansion joint in the event of thermal expansion of the carrier plate 3.

Furthermore, the holding frame 7 has a fixing element 72 at each of its four corners. Specifically, the fixing elements 72 are snap-action hooks. They project beyond the thermal connection layer 5 on the rear side. The carrier plate 3 including light-emitting diode component 2 and thermal connection layer 5 is fixed on a metallic cooling body 6 by means of the fixing elements in such a way that the holding lug 71 presses the carrier plate 3 and the thermal connection layer 5 jointly onto the cooling body 6.

The metallic cooling body 6 is in thermal contact with the thermal connection layer 5; in particular it bears directly on said connection layer. The cooling body 6 has four openings which correspond to the snap-action hooks 72 and through which the snap-action hooks 72 are inserted into the cooling body 6 and latch on the rear side 31 of the carrier plate 3.

In another exemplary embodiment (not illustrated), another thermally sufficiently conductive other system carrier can be provided instead of the metallic cooling body 6.

In still another exemplary embodiment (not illustrated), no holding frame is provided; rather, the carrier plate 3 itself has fixing elements which project beyond the thermal connection layer 5 on the rear side, by means of which it is fixed on a cooling body or system carrier.

Figure 2:
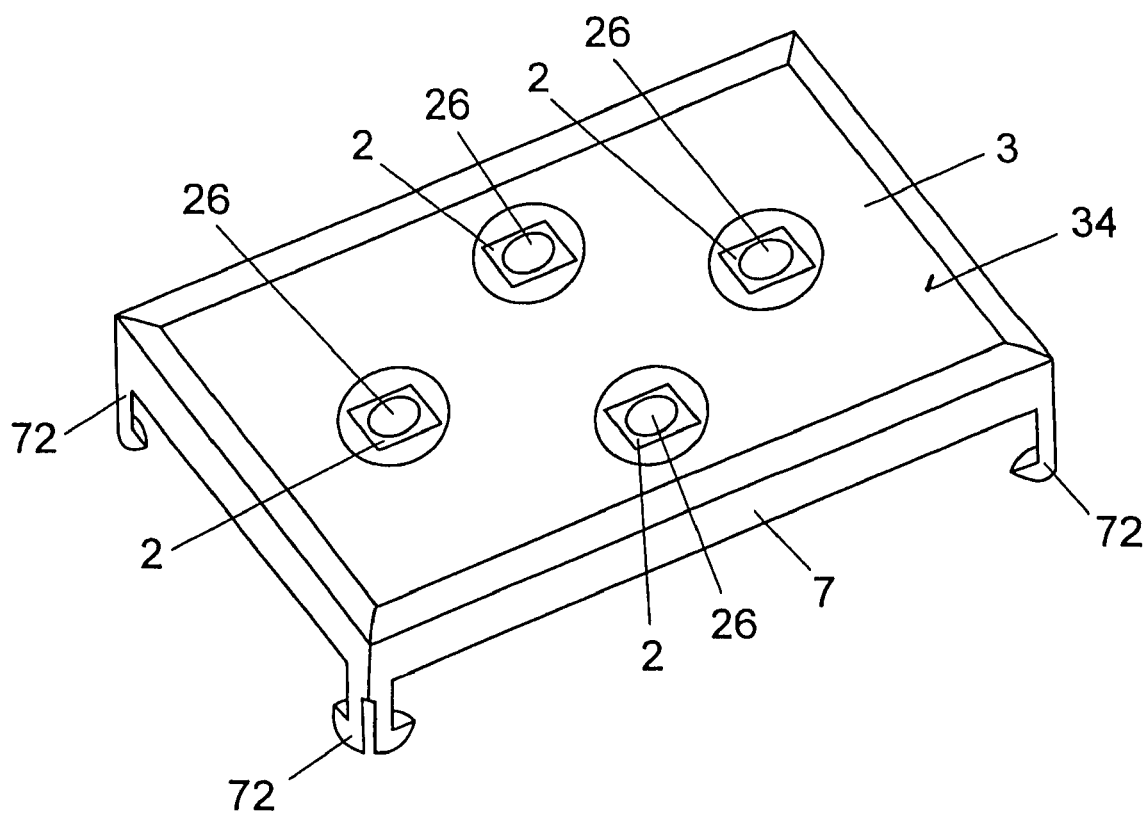
FIG. 2 shows a schematic illustration of a perspective view of the front side of a light-emitting diode system with a plurality of light-emitting diode components.

In a light-emitting diode system 10 having a plurality of light-emitting diode components 2 (cf. FIG. 2), also called light-emitting diode module or LED module, a number of holes corresponding to the number of light-emitting diode components 2 are formed in the carrier plate 3, the light-emitting diode components 2 being mounted into said holes analogously to the exemplary embodiment in accordance with FIG. 1. Likewise analogously to the exemplary embodiment in accordance with FIG. 1, a holding frame 7 with snap-action hooks 72 is provided, into which is clamped the carrier plate 3 with the light-emitting diode components 2 and the thermal connection layer 5. In this LED module, a single thermal connection layer 5 spans the plurality of light-emitting diode components 2. It is also conceivable, however, for the thermal connection layer 5 to be in a plurality of parts and for each part to span only a partial group of the plurality of light-emitting diode components 2.

Figure 3:
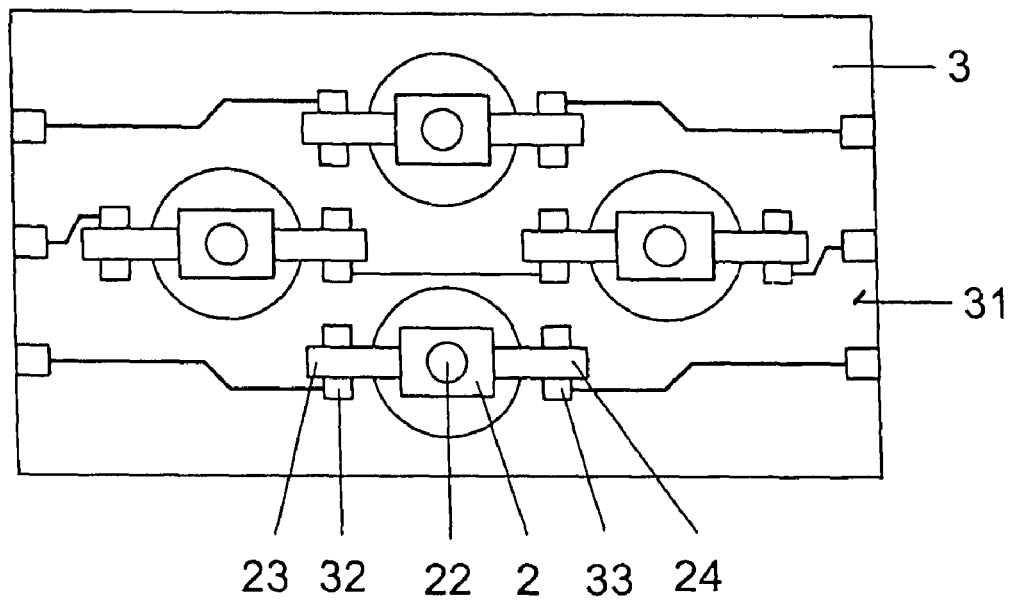
FIG. 3 shows a schematic illustration of a plan view of the rear side of a carrier plate with inserted light-emitting diode components.

Referring to FIG. 3, it serves to illustrate a method for producing such a light-emitting diode system or LED module 10. A plurality of holes (here four) for receiving the light-emitting diode components 2 are formed in a carrier plate 3. Afterward, a light-emitting diode component 2 is inserted into each of the holes from the rear side 31 of the carrier plate 3 and the electrical connection pins 23, 24 are soldered to electrical connection pads of the connection tracks 32, 33 of the carrier plate 3.

Figure 4:
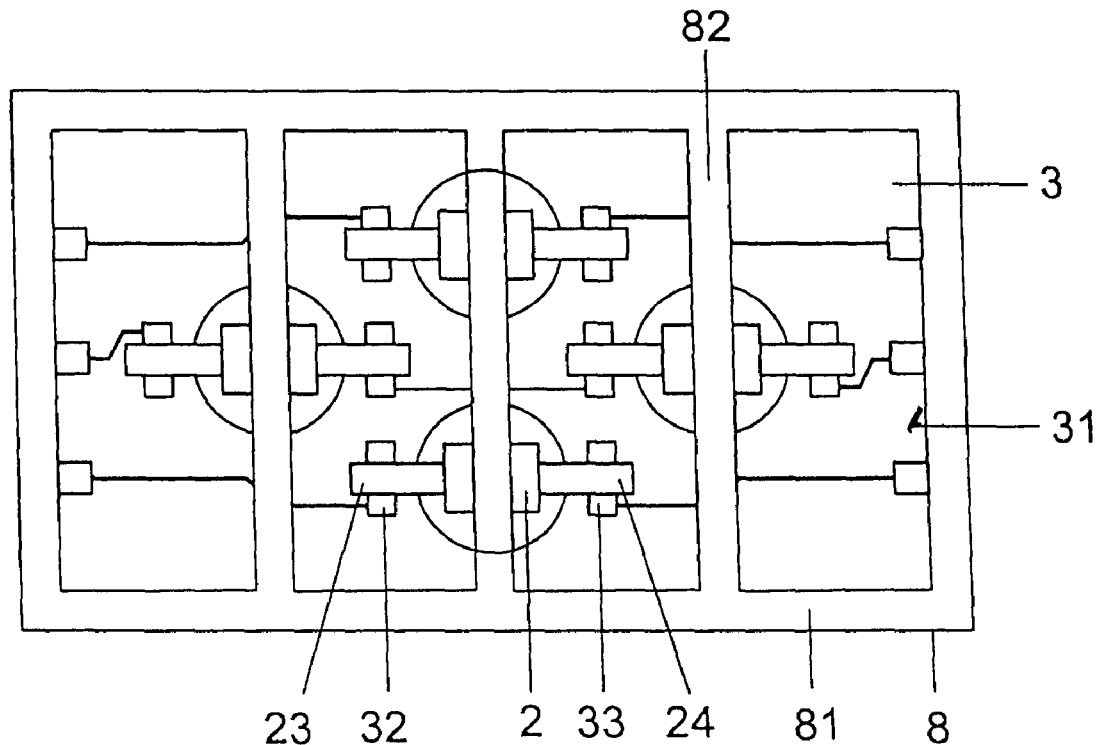
FIG. 4 shows a schematic illustration of a plan view of the rear side of a carrier plate with inserted light-emitting diode components and an emplaced covering element.

For soldering, in one expedient configuration of this method, as illustrated schematically in FIG. 4, a covering element 8 in the form of a frame 81 running around the carrier plate 3 with webs 82 which run over the light-emitting diode components 2 and which hold the light-emitting diode components 2 in the desired position on the carrier plate 3 is placed at the rear side 31 of the carrier plate 3. The connection strips 23, 24 are uncovered between the webs 82. The covering element 8 can be composed, for example, of plastic or some other mechanically and thermally sufficiently stable material. The covering element 8 is removed again after the soldering process. However, it is also conceivable for the covering element 8 to remain on the carrier plate and to function as the thermal connection layer 5 in the light-emitting diode system 1.

For soldering it is possible to use, for example, a selective soldering method (e.g. selective wave soldering or laser soldering) or a conventional wave soldering method.

The invention is not restricted to the exemplary embodiments by the description on the basis of said exemplary embodiments. Rather, the invention encompasses any new feature and any combination of features, which in particular comprises any combination of features in the patent claims, even if this feature or this combination itself is not explicitly specified in the patent claims or exemplary embodiments.

I claim:

1. A light-emitting diode system comprising:
   at least one light-emitting diode component, in which a light-emitting diode chip is arranged in a light-emitting diode housing on a heat sink which can be thermally connected at a rear side of the light-emitting diode housing;
   a carrier plate having a front side and a rear side and a hole for receiving the light-emitting diode component, wherein said light-emitting diode component projects into the hole from the rear side of the carrier plate; and
   an electrically insulating thermal connection layer at the rear side of said carrier plate, said thermal connection layer being thermally conductively connected to said heat sink;
   wherein the electrically insulating thermal connection layer has a cutout in a region of the at least one light-emitting diode component and of electrical connection strips of the at least one light-emitting diode.

2. The light-emitting diode system as claimed in claim 1, wherein the electrical connection strips project laterally from the light-emitting diode housing and bear partly at the rear side of the carrier plate and are connected to the latter.

3. The light-emitting diode system as claimed in claim 2, wherein the electrical connection strips are electrically conductively connected to electrical connection tracks of the carrier plate at least one of by means of a solder and by means of an electrically conductive adhesive.

4. The light-emitting diode system as claimed in claim 2, wherein the electrical connection strips project like wings on opposite sides of the light-emitting diode housing and are bent away from the light-emitting diode housing firstly by means of a first bend toward the rear side of said housing and then away from said housing again by means of a second bend, in such a way that the first bends and at least one partial region between the first and the second bend are situated in the hole of the carrier plate, and at least one partial region of the connection strip bears on the rear side of the carrier plate after the second bend.

5. The light-emitting diode system as claimed in claim 1, wherein the electrically insulating thermal connection layer is a film.

6. The light-emitting diode system as claimed in claim 1, further comprising a cooling body applied on a side of the electrically insulating thermal connection layer remote from the carrier plate.

7. The light-emitting diode system as claimed in claim 1, further comprising a holding frame provided for fixing the carrier plate and the electrically insulating thermal connection layer with respect to one another.

8. The light-emitting diode system as claimed in claim 7, wherein the holding frame is provided with fixing elements, which project beyond the electrically insulating thermal connection layer on a rear side of the electrically insulating thermal connection layer and fix the carrier plate and the electrically insulating thermal connection layer on a cooling body or a system carrier.

9. The light-emitting diode system as claimed in claim 1, wherein the carrier plate has fixing elements which project beyond the electrically insulating thermal connection layer on a rear side of the electrically insulating thermal connection layer and fix on a cooling body or a system carrier.

10. The light-emitting diode system as claimed in claim 1, wherein the carrier plate has a plurality of holes each having a light-emitting diode component and the electrically insulating thermal connection layer spans the plurality of light-emitting diode components on the rear side of the carrier plate.

11. A backlighting device comprising at least one light-emitting diode system as claimed in claim 1.

12. The backlighting device as claimed in claim 11, wherein the backlighting device is arranged is used in an LCD display.

13. The light-emitting diode system as claimed in claim 1, wherein a front side of the electrically insulating thermal connection layer except the cutout bears against the carrier plate.

14. A method for producing a light-emitting diode system comprising at least one light-emitting diode component, in which a light-emitting diode chip is arranged in a light-emitting diode housing on a heat sink which can be thermally connected at a rear side of the light-emitting diode housing, wherein the method comprises the steps of:
   forming at least one hole for receiving the at least one light-emitting diode component in a carrier plate having a front side and a rear side,
   inserting the light-emitting diode component into the hole from the rear side of the carrier plate;
   applying an electrically insulating thermal connection layer at the rear side of the carrier plate, and
   applying the heat sink,
   wherein the at least one light-emitting diode component is pressed onto the carrier plate by a covering element when connecting the at least one light-emitting diode component to the carrier plate, and
   wherein the covering element is placed at the rear side of the carrier plate.

15. The method as claimed in claim 14, further comprising:
   providing the light-emitting diode component with electrical connection strips which project laterally from the light-emitting diode housing,
   placing the electrical connection strips onto electrical connection conductors of the carrier plate, and
   electrically conductively connecting the electrical connection strips to the conductors.

16. The method as claimed in claim 15, wherein the electrical connection strips are connected to the electrical connection conductors of the carrier plate by a selective soldering method.

17. The method as claimed in claim 15, wherein the covering element has cutouts through which each of the connection strips are at least partly uncovered.

18. A light-emitting diode system comprising:
   at least one light-emitting diode component, in which a light-emitting diode chip is arranged in a light-emitting diode housing on a heat sink which can be thermally connected at a rear side of the light-emitting diode housing;
   a carrier plate having a front side, a rear side, and a hole for receiving the light-emitting diode component, said light-emitting diode component protecting into the hole from the rear side of the carrier plate;
   an electrically insulating thermal connection layer arranged at the rear side of said carrier plate and being thermally conductively connected to said heat sink; and
   a holding frame fixing the carrier plate and the electrically insulating thermal connection layer with respect to each other,
   wherein the electrically insulating thermal connection layer projects laterally beyond the carrier plate and is latched into a cutout in the holding frame.

19. The light-emitting diode system as claimed in claim 18, wherein the holding frame has a holding lug positioned at the front side of the carrier plate, the holding lug bearing on the front side of the carrier plate.

20. The light-emitting diode system as claimed in claim 19, wherein the holding lug extends around the carrier plate.

* * * * *